(12) United States Patent
Torii

(10) Patent No.: US 7,847,316 B2
(45) Date of Patent: Dec. 7, 2010

(54) SEMICONDUCTOR DEVICE AND ITS MANUFACTURE

(75) Inventor: Katsuyuki Torii, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 192 days.

(21) Appl. No.: 11/994,514

(22) PCT Filed: Mar. 22, 2006

(86) PCT No.: PCT/JP2006/305702

§ 371 (c)(1),
(2), (4) Date: Jan. 3, 2008

(87) PCT Pub. No.: WO2007/007445

PCT Pub. Date: Jan. 18, 2007

(65) Prior Publication Data

US 2009/0166809 A1    Jul. 2, 2009

(30) Foreign Application Priority Data

Jul. 7, 2005    (JP)    ............................ 2005-198447

(51) Int. Cl.
*H01L 29/06*    (2006.01)
(52) U.S. Cl. ................ 257/133; 257/618; 257/E21.506
(58) Field of Classification Search ................ 257/133, 257/139, 686, 777, 618
See application file for complete search history.

(56) References Cited

U.S. PATENT DOCUMENTS

| 6,031,279 A | 2/2000 | Lenz |
| 6,055,148 A | 4/2000 | Grover |
| 6,577,008 B2 | 6/2003 | Lam et al. |
| 2002/0024147 A1* | 2/2002 | Jung et al. ................... 257/779 |
| 2002/0113247 A1* | 8/2002 | Magri et al. ................. 257/133 |
| 2006/0202228 A1 | 9/2006 | Kanazawa |

FOREIGN PATENT DOCUMENTS

| DE | 19515189 | 11/1996 |
| JP | 61239656 | 10/1986 |
| JP | 62152135 | 7/1987 |
| JP | 11008385 | 1/1999 |
| JP | 2001284525 | 10/2001 |
| JP | 2005072519 | 3/2005 |
| WO | 2007007445 | 1/2007 |

* cited by examiner

*Primary Examiner*—Chuong A Luu
*Assistant Examiner*—Nga Doan
(74) *Attorney, Agent, or Firm*—Bachman & LaPointe, P.C.

(57) ABSTRACT

A reliable semiconductor device is provided which comprises lower and upper IGBTs 1 and 2 preferably bonded to each other by solder, and a wire strongly connected to lower IGBT 1. The semiconductor device comprises a lower IGBT 1, a lower electrode layer 5 secured on lower IGBT 1, an upper electrode layer 6 secured on lower electrode layer 5, an upper IGBT 2 secured on upper electrode layer 6, and a solder layer 7 which connects upper electrode layer 6 and upper IGBT 2. Lower and upper electrode layers 5 and 6 are formed of different materials from each other, and upper electrode layer 6 has a notch 36 to partly define on an upper surface 5a of lower electrode layer 5 a bonding region 15 exposed to the outside through notch 36 so that one end of a wire 8 is connected to bonding region 15. Upper electrode layer 6 can be formed of one material superior in soldering, and also, lower electrode layer 5 can be formed of another material having a high adhesive strength to wire 8.

4 Claims, 5 Drawing Sheets

SEMICONDUCTOR DEVICE AND ITS MANUFACTURE

FIELD IN INDUSTRY

This invention relates to a semiconductor device, in particular of the type having a plurality of semiconducting elements laid one on top of another for the small-sized semiconductor device.

BACKGROUND

The following Patent Document 1 discloses a known semiconductor device which comprises a metallic support plate, first and second transistors piled up in turn on the support plate, third and fourth transistors piled up in turn on the support plate, and a control circuit (control IC) mounted on the support plate and between the first and second transistors and between the third and fourth transistors to cause the first, second, third and fourth transistors to form an H-type bridge circuit. In Patent Document 1, first and second transistors are stacked, and third and fourth transistors are stacked to reduce occupation space of the support plate and increase the integration degree of the device.

Also, in the semiconductor device of Patent Document 1, each lower electrode formed on the bottom surface of second and fourth transistors is secured by solder on each upper electrode formed on the top surface of first and third transistors, and upper electrodes of first and third transistors are electrically connected via wires to an upper electrode of the control circuit and a plurality of outer leads disposed around the support plate. The direct electric connections by solder between first and second transistors and between third and fourth transistors serve to advantageously shorten flow paths of electric current while preventing noise and power loss which may occur with an elongated flow path and also simplifying wiring connections.

[Patent Document 1] WO 2005/018001

DISCLOSURE OF INVENTION

Problem to be Solved by Invention

In the above semiconductor device, upper electrodes of first and third transistors located on the bottom side are made of any metallic material suitable for bonding by solder to lower electrodes of second and fourth transistors or for bonding to wiring. Electrodes formed of metallic material such as nickel or copper excellent in good soldering property are inferior in bonding to wiring formed of metallic material such as aluminum or gold. Also, electrodes formed of metallic material such as aluminum indicating a high adhesive strength to wiring, are inferior in bonding or wetting to solder consisting of metallic material such as lead or tin. For that reason, the semiconductor device shown in Patent Document 1 cannot have simultaneous high adhesive strengths to both solder and wiring.

Accordingly, an object of the present invention is to provide a semiconductor device superior in adhesive strengths to both solder and wiring, and a manufacture of the semiconductor device.

Means for Solving the Problem

The semiconductor device according to the present invention, comprises a lower semiconducting element (1), a lower electrode layer (5) formed on an upper surface (1a) of lower semiconducting element (1), an upper electrode layer (6) formed on an upper surface (5a) of lower electrode layer (5), an upper semiconducting element (2) secured on an upper surface (6a) of upper electrode layer (6), and an adhesive layer (7) for bonding upper electrode layer (6) and upper semiconducting element (2). Upper surfaces (5a, 6a) of lower and upper electrode layers (5, 6) are formed of different materials from each other. Upper surface (5a) of lower electrode layer (5) have a bonding region (15) exposed to outside of upper electrode layer (6) to attach an end of a lead wire (8) on bonding region (15).

The method for producing a semiconductor device according to the present invention, comprises the steps of forming a lower electrode layer (5) on an upper surface (1a) of a lower semiconducting element (1), forming an upper electrode layer (6) on an upper surface (5a) of lower electrode layer (5), the upper electrode layer (6) having an upper surface (6a) formed of a material different from that of upper surface (5a) of lower electrode layer (5), forming a notch (36) in upper electrode layer (6) to partly define on upper surface (5a) of lower electrode layer (5) a bonding region (15) exposed to the outside through notch (35), securing through an adhesive layer (7) an upper semiconducting element (2) on upper surface (6a) of upper electrode layer (6), and bonding an end of a lead wire (8) on bonding region (15).

As upper surfaces (5a, 6a) of lower and upper electrode layers (5, 6) provided between lower and upper semiconducting elements (1, 2) can be made of different materials, upper surface (6a) of upper electrode layer (6) can be made of a material superior in soldering property, and upper surface (5a) of lower electrode (5) can be made of another material having a high bonding or adhesive strength to lead wire (8). Accordingly, lower and upper semiconducting elements (1, 2) can be preferably bonded through adhesive layer (7) such as solder or the like, and lead wire (8) can be firmly joined to lower semiconducting element (1) to provide a reliable semiconductor device.

EFFECT OF INVENTION

In accordance with the present invention, a semiconductor device can be materialized which has high bonding or adhesive strengths of both soldering between upper and lower semiconducting elements and joining of wiring to semiconductor elements.

EXPLANATION OF SYMBOLS

1 . . . A lower semiconducting element (A lower IGBT), 1a, 2a, 5a, 6a . . . Upper surfaces, 2 . . . An upper semiconducting element (An upper IGBT), 5 . . . A lower electrode layer, 6 . . . An upper electrode layer, 7 . . . A solder layer, 8 . . . Lead wires (Wiring); 9 . . . A protective layer, 15 . . . A bonding region, 19 . . . Openings, 20 . . . Cell-forming regions, 20a . . . Cells, 21 . . . A bonding layer, 23 . . . A connection layer, 36 . . . A notch, 40 . . . A control device.

BEST MODE FOR CARRYING OUT THE INVENTION

Embodiments of the semiconductor device and its manufacture according to the present invention are described hereinafter with reference to FIGS. 1 to 12.

Figure 1:
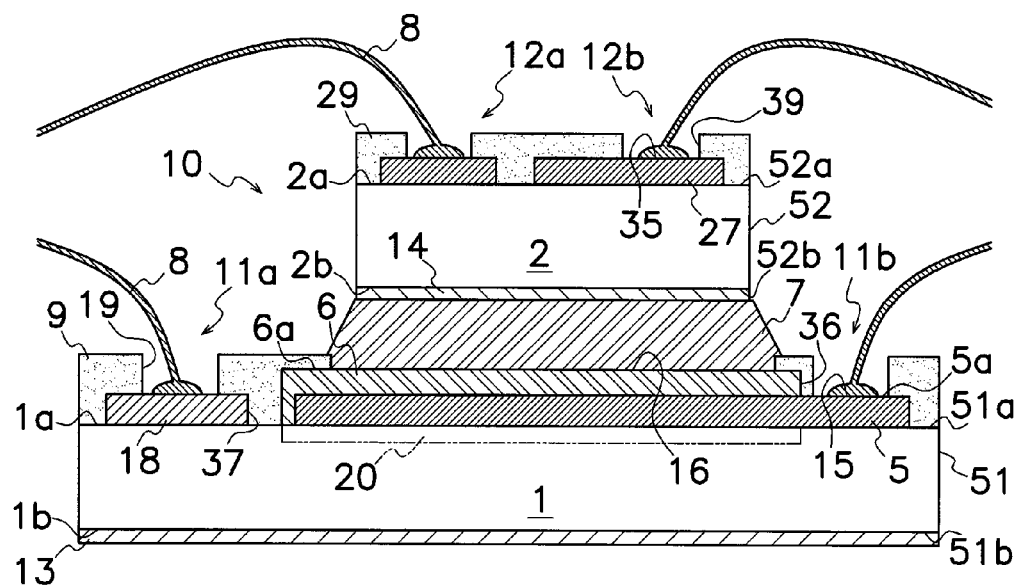
FIG. 1 A cross section showing an embodiment of a semiconductor device according to the present invention.

As shown in FIG. 1, the semiconductor device of this embodiment comprises a lower IGBT 1 (Insulated Gate Bipolar Transistor) as a lower semiconducting element, a lower electrode layer 5 formed on an upper surface 1a of lower IGBT 1, a separate electrode layer (a gate pad) 18 formed on upper surface 1a of lower IGBT 1 away from lower electrode layer 5, an upper electrode layer 6 formed on an upper surface 5a of lower electrode layer 5, an upper IGBT 2 as an upper semiconducting element secured on upper surface 6a of upper electrode layer 6 by a solder layer 7 as an adhesive layer, an uppermost electrode layer 27 formed on an upper surface 2a of upper IGBT 2, a first nonconductive protective film 9 which seals each portion of upper electrode layer 6, separate electrode layer 18, lower electrode layer 5 and the like, and a second nonconductive protective film 29 which seals a portion of an uppermost electrode layer 27 and the like. Lower electrode layer 5 has a bonding region 15 exposed to the outside through a notch 36 formed in upper electrode layer 6 and openings 19 formed in first nonconductive protective film 9. One end of a wire 8 as a lead wire is connected by wire-bonding to flat bonding region 15.

Figure 2:
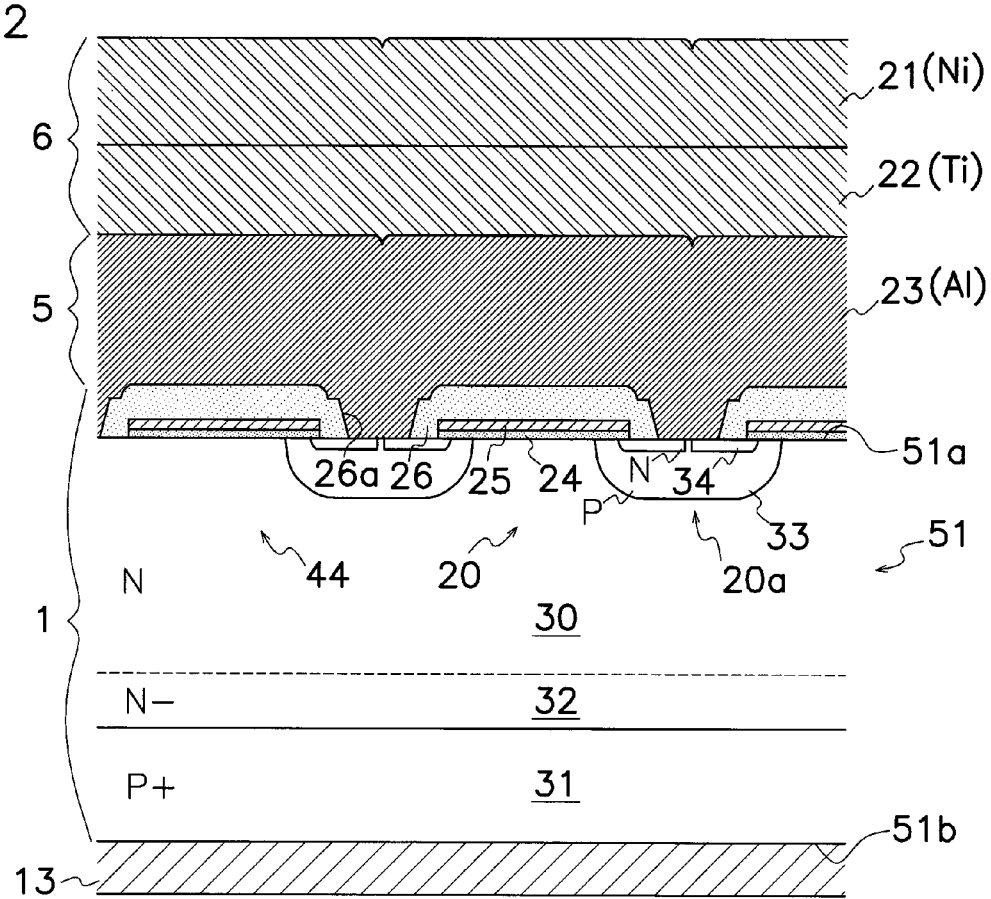
FIG. 2 A partly enlarged view of FIG. 1.

As shown in FIG. 2, lower IGBT 1 comprises a lower semiconductor substrate 51 formed of for example silicon monocrystal, a gate insulation film 24 formed of for example silicon dioxide on an upper surface 51a of lower semiconductor substrate 51, a gate (control) electrode 25 formed of for example polysilicon on an upper surface 51a of lower semiconductor substrate 51 through gate insulation film 24, an intermediate insulation layer 26 which electrically isolates between gate electrode 25 and lower electrode layer 5, and collector (bottom) electrode 13 formed by layering aluminum and nickel on a bottom surface 51b of lower semiconductor substrate 51.

Lower semiconductor substrate 51 comprises a collector region 31 of P+ type semiconductor region for forming bottom surface 51b of lower semiconductor substrate 51, N− type buffer region 32 formed on collector region 31, N type base region 30 formed on N− type buffer region 32, P type base region 33 formed within N type base region 30 at the same level as upper surface 51a of lower semiconductor substrate 51, and an N type emitter region 34 formed within P type base region 33 at the same level as upper surface 51a of lower semiconductor substrate 51. Gate electrodes 25 are formed through gate insulation film 24 on P type base regions 33 formed between N type emitter region 34 and N type base region 30 to define a well-known channel region between N type base region 30 and emitter region 34 in P type base region 33 adjacent to gate insulation film 24. As shown in FIG. 2, openings 26a are formed in intermediate insulation layer 26 which electrically isolates between gate electrode 25 and lower electrode layer 5, and lower electrode layer 5 is electrically connected to N type emitter region 34 and P type base region 33 through openings 26a to form emitter electrodes.

Figure 3:
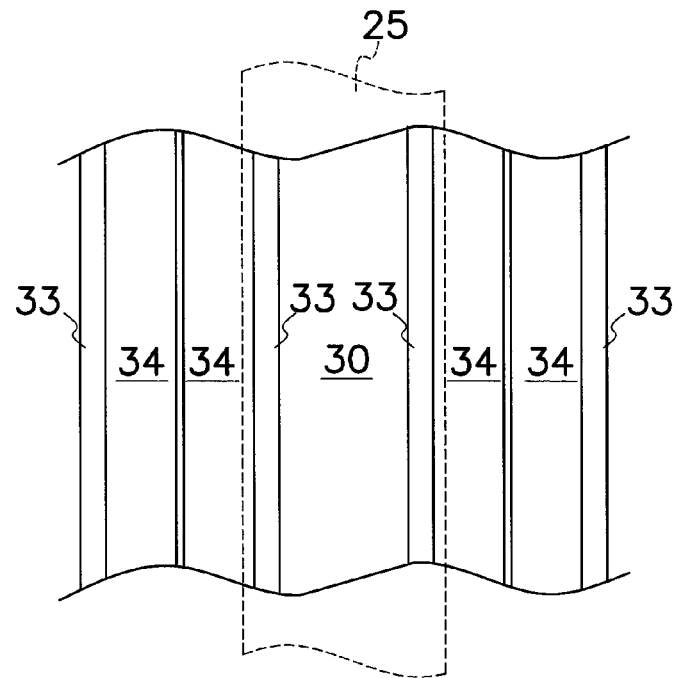
FIG. 3 A partly enlarged view of a lower semiconductor substrate in FIG. 1.
Figure 4:
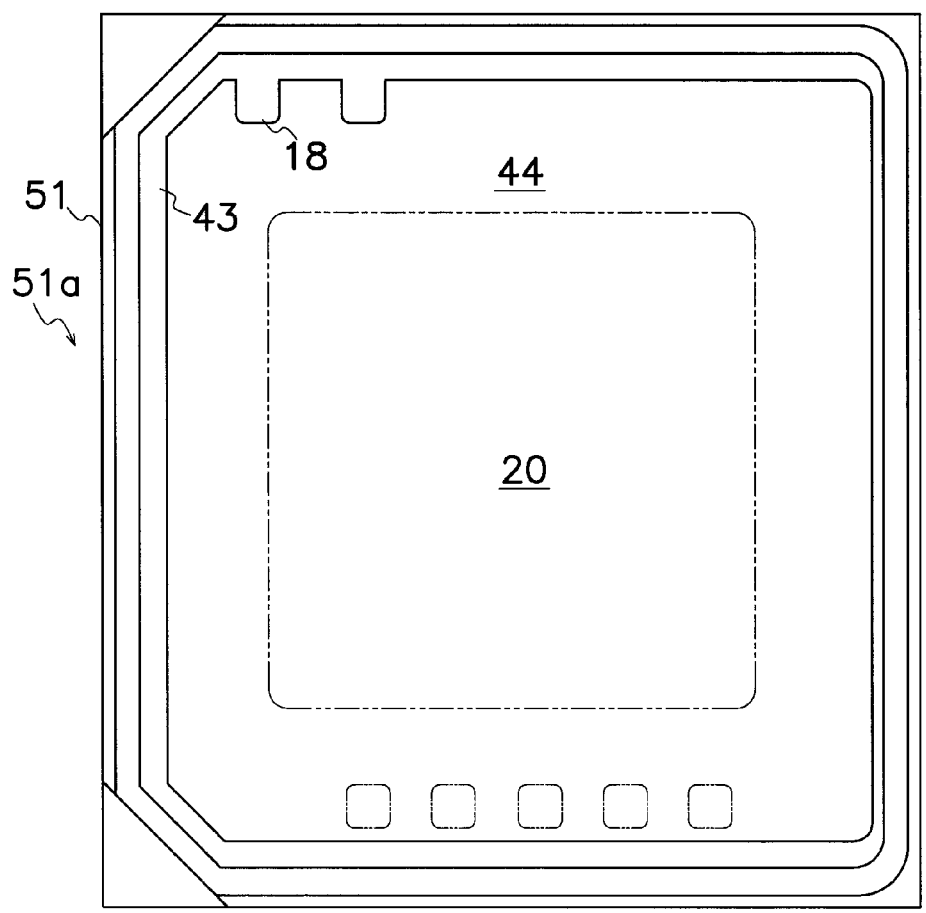
FIG. 4 A plan view of the lower semiconductor substrate in FIG. 1.

FIGS. 3 and 4 show an upper surface 51a of lower semiconductor substrate 51. As shown in FIG. 3, a plurality of P type base regions 33 are apposed to each other in N type base regions 30 in a latticed or striped pattern on a plane which includes upper surface 51a of lower semiconductor substrate 51. Two N type emitter regions are formed in each P type base region 33 to extend along, adjacent to and in parallel to a longitudinal edge of P type base region 33 so that P type base region 33 and N type emitter regions 34 therein are incorporated together to define a minimum unit of a semiconductively active region referred to as a cell 20a. Gate electrodes 25 are formed on upper surface 51a of lower semiconductor substrate 51 in a striped pattern while laterally extending between and bridging adjacent P type base regions to define cells 20a of semiconductively active region's minimum units in lower IGBT 1. In the semiconductor device of this embodiment, N type emitter regions 34 are formed only on a central area of lower semiconductor substrate 51 and not on an outer periphery of lower semiconductor substrate 51 so that, as shown in FIG. 4, upper surface 1a of lower IGBT 1 comprises a cell-forming region 20 formed on the central area of lower IGBT 1 and a cell-free or non-cell region 44 annularly formed on the outer periphery of lower IGBT 1 for surrounding cell-forming region 20. Alternatively, P type base regions 33 may be formed into islands shape in N type base region 30.

Also, a gate bus line 43 is formed on upper surface 51a of lower semiconductor substrate 51 along a peripheral surface of lower semiconductor substrate 51 to electrically connect gate electrode 25 and separate electrode layer 18 formed on cell-free region 44 of lower IGBT 1. Both of separate electrode layer 18 and gate bus line 43 are made of conductive metallic material such as aluminum to cover an extension of striped gate electrodes 25 for electrical connection between separate electrode layer 18 or gate bus line 43 and gate electrode 25. To this end, separate electrode layer 18 and gate bus line 43 comprise a layered structure of polysilicon and aluminum on upper surface 51a of lower semiconductor substrate 51.

Upper IGBT 2 has upper and lower surfaces 2a, 2b of their smaller areas than those of upper and lower surfaces 1a, 1b of lower IGBT 1. Although not shown in detail in the drawings, but, upper IGBT 2 comprises an upper semiconductor substrate 52 which also has a cell-forming region 20 on an upper surface 52a of upper semiconductor substrate 52, a gate insulation film formed on upper surface 52a of upper semiconductor substrate 52, a gate electrode formed on upper surface 52a of upper semiconductor substrate 52 through gate insulation film, an uppermost electrode layer (emitter electrode) 27 electrically connected to cells 20a, an intermediate insulation layer 26 for electrically isolating between gate electrode and uppermost electrode layer 27, and a collector electrode 14 formed on a bottom surface 52b of upper semiconductor substrate 52. It should be noted that, although a same reference symbol "20" is applied for the only purpose of illustration to cell-forming region on an upper surface 52a of upper semiconductor substrate 52 and cell-forming region on the central area of lower IGBT 1, these cell-forming regions are completely different from each other. However, upper IGBT 2 may comprises cell-forming region 20 only on the central area of upper semiconductor substrate 52, similarly to lower IGBT 1, and otherwise, cell-forming region 20 may be formed on the whole upper surface 52a of upper semiconductor substrate 52.

Lower electrode layer 5 of lower IGBT 1 is electrically connected to N type emitter regions 34 and P type base regions 33. Also, lower electrode layer 5 extends to outside of cell-forming region 20 to cover a part of upper surface of cell-free region 44 in a plan view. Upper electrode layer 6 is formed on upper surface 5a of lower electrode layer 5 and extends to outside of cell-forming region 20 to cover a part of upper surface of cell-free region 44 in the plan view. In other words, cell-forming region 20 is located at a central area of lower semiconductor substrate 51 inside of cell-free region 44 in the plan view.

Upper surfaces 5a and 6a of lower and upper electrode layers 5 and 6 are made of different materials from each other; lower electrode layer 5 has a connection layer 23 formed adjacent to upper electrode layer 6; connection layer 23 is powerfully adhesive to metallic material of wire 8; upper electrode layer 6 has a bonding layer 21 formed adjacent to solder layer 7 and an intermediate layer 22 formed between lower electrode layer 5 and bonding layer 21; and bonding layer 21 forms an upper surface 6a of upper electrode layer 6 which has a strongly adhesive property to a metallic material of solder layer 7. As illustrated in FIG. 2, lower electrode layer 5 consists only of connection layer 23 made of a metallic material such as aluminum or silicon-containing aluminum powerfully adhesive to aluminum in wire 8. On the contrary, bonding layer 21 of upper electrode layer 6 is formed of a metallic material such as nickel superior in adhesion to solder layer 7, and intermediate layer 22 of upper electrode layer 6 is formed of for example titanium. Likewise, lower electrode layer 5 may be formed by a layered structure of plural different metallic materials.

In this embodiment, bonding layer 21 of upper electrode layer 6 is made of nickel well wetting (compatible) to solder layer 7, but bonding layer 21 may be formed of another metallic material such as gold well wetting to solder layer 7. Also, lower electrode layer 5 may be formed of another metallic material than aluminum as well. Intermediate layer 22 can be made of a suitably selected metallic material compatible to both bonding layer 21 and connection layer 23 of lower electrode layer 5.

First and second protective films 9 and 29 are made of heat-resistible material such as polyimide film (PIF) or polybenzothiazole (PBO), and first protective film 9 formed on lower IGBT 1 has openings 19 which expose bonding regions 15 of lower electrode layer 5 to the outside, and second protective film 29 formed on upper IGBT 2 has openings 39 which expose bonding regions 35 of uppermost electrode layer 27 to the outside. First and second protective layers 9 and 29 preserve lower and upper IGBTs 1 and 2 from entry of foreign matter such as ions therein. Uppermost electrode layer 27 on upper surface 2a of upper IGBT 2 is formed of metallic material powerfully adhesive to metallic material in wire 8 like lower electrode layer 5.

As shown in FIG. 1, each of bonding regions 15 of lower electrode layer 5 provides a wire connecting area (a wire bonding pad) for emitter electrode of lower IGBT 1 for connection for example to an outer element via wire 8. Upper surface 6a of upper electrode layer 6 has a bare area exposed to the outside through opening 19 of first protective film 9 to provide a soldering area (a die bonding pad) 16 for electrically connecting collector electrode 14 of upper IGBT 2 through solder layer 7. In other words, soldering area 16 of upper electrode layer 6 is formed into a nickel electrode surface of good solderability on which upper IGBT 2 is bonded via solder layer 7, whereas bonding region 15 is formed into an aluminum electrode surface superior in bonding of wire 8. As the present invention can allow different metallic materials to be formed into upper surfaces 5a and 6a of lower and upper electrode layers 5 and 6 between lower and upper IGBTs 1 and 2, upper surface 5a of lower electrode layer 5 can be made of one material firmly adhesive to wire 8, and upper surface 6a of upper electrode layer 6 can be made of another material of good solderability. Accordingly, solder layer 7 positively bonds between lower and upper IGBTs 1 and 2, and wire 8 can be strongly bonded on lower IGBT 1 to provide a reliable semiconductor device 10. The adhesive material used in the present invention includes bonding adhesives, more preferably electrically conductive adhesive agent such as soldering material, brazing material and silver paste. Soldering material basically includes lead-free solder such as tin, silver, copper or aluminum, however, typical and other well-known solders including tin and lead may also be used. Wire 8 may include well-known wiring made of gold, aluminum or silicon-containing aluminum.

In making the semiconductor device 10 shown in FIG. 1, lower IGBT 1 is prepared which has cell-forming region 20 of plural cells 20a in the central area on upper surface 1a, and likewise, upper IGBT 2 is prepared which has also cell-forming region on upper surface 2a. As shown in FIG. 3, lower IGBT 1 has cell-forming region 20 formed in the central area on upper surface 51a of lower semiconductor substrate 51, and cell-free region 44 annularly formed for surrounding cell-forming region 20. However, further description is omitted herein because a method for making a semiconductor element such as lower and upper IGBTs 1 and 2 is well-known.

Figure 5:
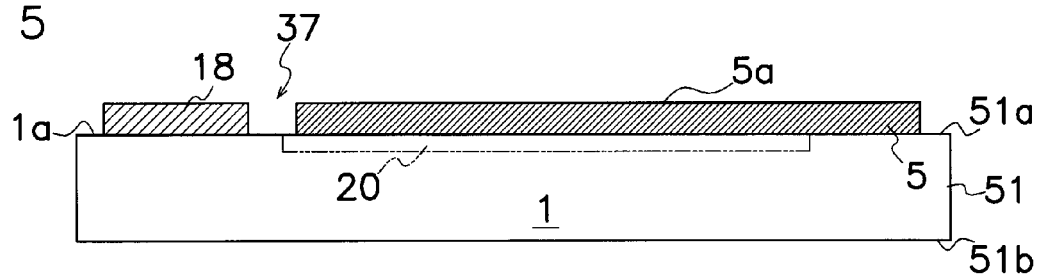
FIG. 5 A cross section of a lower electrode layer formed on an upper surface of the lower semiconductor substrate.

As shown in FIG. 5, lower electrode layer 5 is formed of aluminum on upper surface 51a of lower semiconductor substrate 51 utilizing a well-known technique of for example vapor deposition such as chemical or physical vapor deposition (CVD, PVD) or plating. Then, an etching mask (not shown) is covered on upper surface 5a of lower electrode layer 5, and etching solution, which preferably contains phosphoric acid capable of dissolving aluminum, is poured in openings formed in etching mask to remove unnecessary portions of lower electrode layer 5 and thereby form cutouts 37 between lower electrode layer 5 and separate electrode layer 18. Lower electrode layer 5 extends beyond outer periphery of cell-forming region 20 to cover a part of upper surface of cell-free region 44 in the plan view.

Figure 6:
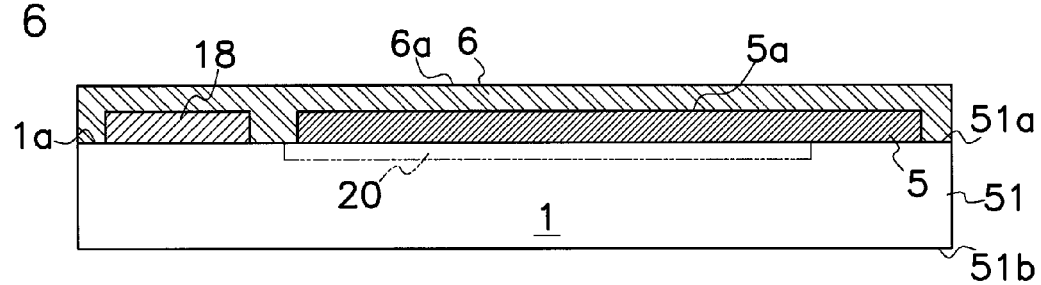
FIG. 6 A cross section of an upper electrode layer formed on an upper surface of the lower electrode layer in FIG. 5.
Figure 7:
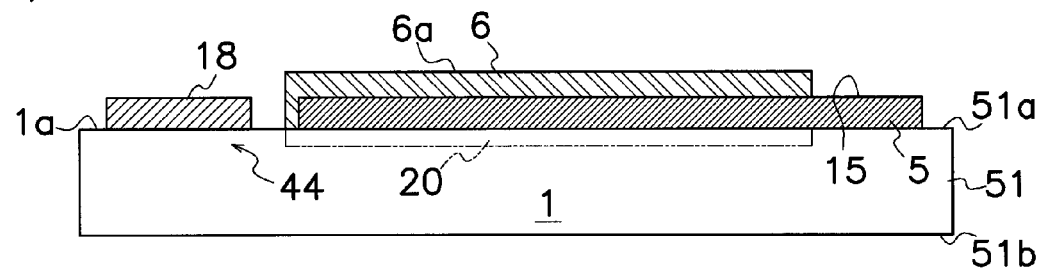
FIG. 7 A cross section of the etched upper electrode layer in FIG. 6.

Subsequently, as shown in FIG. 6, intermediate layer 22 of titanium and bonding layer 21 of nickel are formed in order on upper surface 5a of lower electrode layer 5 to complete upper electrode layer 6 in a similar manner to that for making up lower electrode layer 5. This ensures that lower and upper electrode layers 5 and 6 can be layered on upper surface 1a of lower IGBT 1. Then, an etching mask is formed on upper surface 6a of upper electrode layer 6, and metal etching solution, which preferably contains hydrochloric acid capable of simultaneously dissolving titanium and nickel, is poured in openings formed in etching mask to remove unnecessary portions of upper electrode layer 6 as shown in FIG. 7. Titanium and nickel can be in turn removed with different etching solutions supplied into openings. Also, this etching process concurrently serves to cut off a portion of upper electrode layer 6 outside of cell-forming region 20 and over a part of cell-free region 44, and thereby form notches 36 in upper electrode layer 6 to expose to the outside bonding regions 15 on upper surface 5a of lower electrode layer 5 through notches 36. Accordingly, upper electrode 6 extends beyond cell-forming region 20 to a part of cell-free region 44 in the plan view to form bonding regions 15 on lower electrode layer 5 outside of cell-forming region 20 on lower semiconductor substrate 51.

During etching process of upper electrode layer 6 with etching solution, lower electrode layer 5 may also disadvantageously be etched together with upper electrode layer 6, however, electrode layer 5 can positively prevent etching of cell-forming region 20 to avoid degradation of electric property in the semiconductor device because etching process cuts off a portion of upper electrode layer 6 outside of cell-forming region 20. In other words, lower electrode layer 5 serves to electrically connect P type base regions 33 and N type emitter regions 34 in multiple cells 20a, and therefore, etching of lower electrode layer 5 formed on cell-forming region 20 may cause undesirable damage to electric property of lower IGBT 1. To avoid such damage, upper electrode layer 6 extends to cell-free region 44 outside of cell-forming region 20 in lower IGBT 1 to provide bonding region 15, and etching of upper electrode layer 6 over cell-free region 44, if any, hardly causes any damage to cell-forming region 20 and electric property of lower IGBT 1 to provide a highly reliable semiconductor device of stable electric property.

Figure 8:
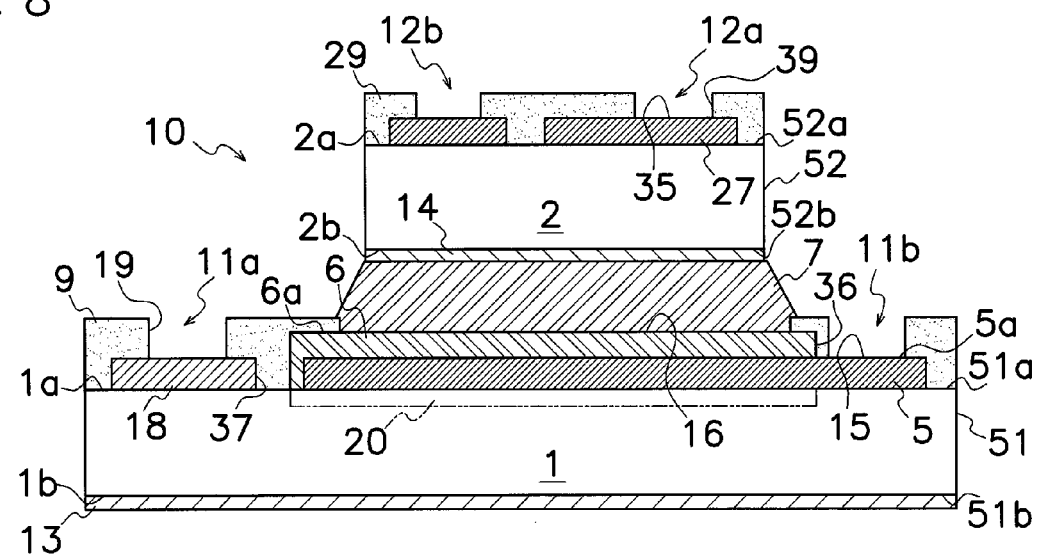
FIG. 8 A cross section of an upper IGBT on the upper electrode layer in FIG. 6.
Figure 9:
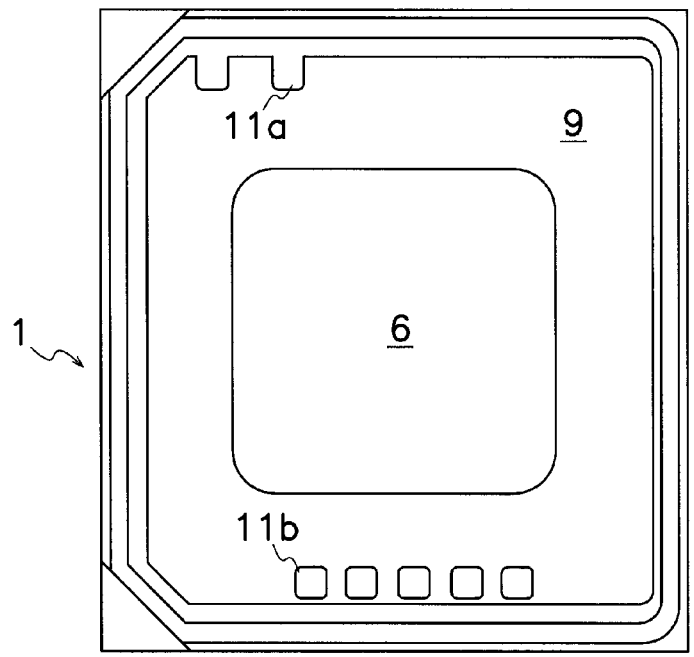
FIG. 9 A plan view showing a first protective film coated on a lower semiconductor substrate in FIG. 7.

After that, first protective film 9 is formed to seal each appropriate portion of upper electrode layer 6, separate electrode layer 18 and lower electrode layer 5 while at the same time providing openings 19 to expose to the outside two bonding pad areas on bonding region 15 and separate electrode layer 18 and also a pad area on soldering area 16. As shown in FIG. 8, upper IGBT 2 is secured on soldering area 16 over lower IGBT 1 through solder layer 7 in opening 19. Upper IGBT 2 has preformed uppermost electrode layer 27, second protective film 29 and collector electrode 14. First protective film 9 is formed in an annular shape as shown in FIG. 9 to settle upper IGBT 2 in position because solder layer 7 for supporting upper IGBT 2 can properly be secured on soldering area 16 surrounded by first protective film 9. In this way, upper IGBT 2 can be soldered in position of lower IGBT 1 with accuracy as shown in FIG. 1, and first protective film 9 serves to dam molten solder layer 7 and prevent effusion thereof from soldering area 16 encompassed by first protective film 9. This ensures relatively thicker solder layer 7 on soldering area 16, and heat produced during operation of the semiconductor device 10 can be radiated to the outside through thicker solder layer 7.

Collector electrode 13 formed on bottom surface 51b of lower semiconductor substrate 51 is secured on an upper surface of a support plate 45 via solder. Also, each one end of wires 8 shown in FIG. 1 is connected to outer elements or outer leads and each the other end of wires 8 is connected to bonding regions 15 and 35 and separate electrode layer 18 of lower and upper IGBTs 1 and 2 to finish the semiconductor device 10.

Figure 10:
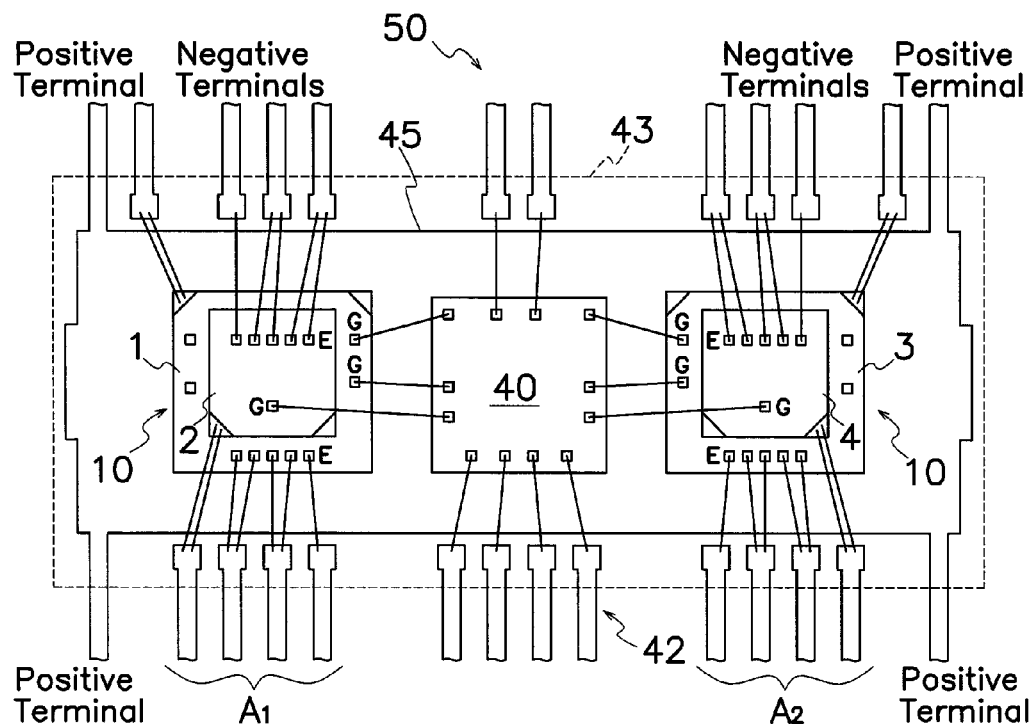
FIG. 10 A plan view showing an embodiment of the semiconductor device in FIG. 1.
Figure 11:
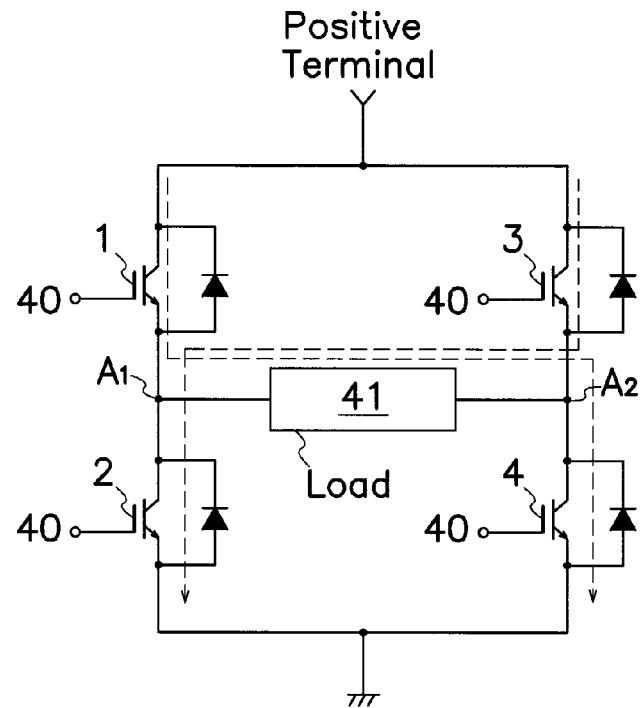
FIG. 11 An electric circuit diagram of FIG. 10.

FIG. 10 illustrates a further embodiment of a semiconductor device 50 according to the present invention as a single unit of H-type bridge circuit of FIG. 11 formed into a configuration of the semiconductor device 10 shown in FIG. 1. H-type bridge circuit comprises first and second lower IGBTs 1 and 3 of high-voltage side and first and second upper IGBTs 2 and 4 of low-voltage side. A first stack of first lower and upper IGBTs 1 and 2 and a second stack of second lower and upper IGBTs 3 and 4 are mounted on a support plate 45 formed of heat radiating metallic material such as copper or aluminum. Semiconductor device 50 further comprises a control device 40 for controlling switching operation of lower and upper IGBTs 1 to 4, a plurality of outer leads 42 disposed around support plate 45, and wires 8 for electrically connecting surface electrodes of control device 40, bonding regions (emitter electrodes) 15 and 35 and separate electrodes (gate electrodes) 18 of lower and upper IGBTs 1 and 2. As shown in FIG. 10, control device 40 is secured on support plate 45 between first and second stacks. An electric load 41 is connected between a junction $A_1$ of lower electrode layer (an emitter electrode) 5 of first lower IGBT 1 and collector electrode 14 of first upper IGBT 2 and a junction $A_2$ of lower electrode layer (an emitter electrode) of second lower IGBT 3 and collector electrode of second upper IGBT 4, and by way of example, electric load 41 comprises a cold cathode fluorescent discharge tube driven by alternating current. Typically, a whole of semiconductor device 50 is encapsulated by a plastic encapsulant 48 from which outer leads 42 are derived to the outside.

In operation of H-type bridge circuit, control device 40 is operated to alternately turn on and off a first pair of first lower IGBT 1 and second upper IGBT 4 and a second pair of first upper IGBT 2 and second lower IGBT 3 to produce alternate current flowing through load 41 or cold cathode fluorescent discharge tube in the bilaterally adverse directions between junctions $A_1$ and $A_2$ so that discharge tube can be lighted up. In this way, cold cathode fluorescent discharge tube can be lighted by switching operation of first and second pairs of first lower, second upper, first upper and second lower IGBTs 1 to 4 utilizing a power source of DC voltage. Semiconductor device 50 shown in FIG. 10 can have its reduced occupation space with the improved integration degree. At the same time, upper IGBTs 2 and 4 can be firmly secured respectively on lower IGBTs 1 and 3 via solder layer 7, and wires 8 can be strongly connected on each of IGBTs 1 to 4 to provide the reliable semiconductor device.

Figure 12:
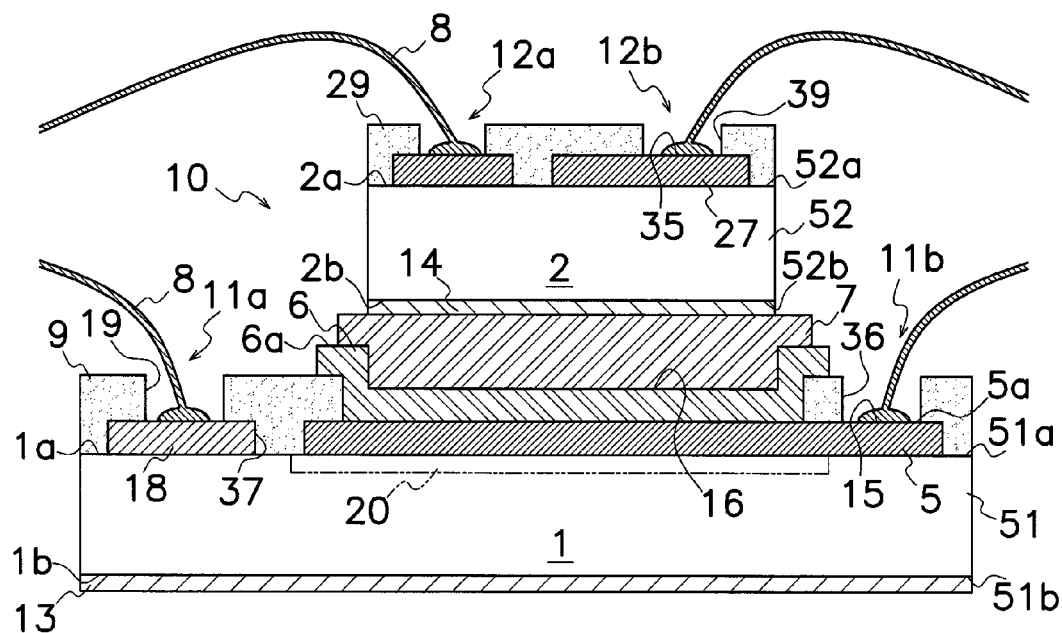
FIG. 12 A cross section showing a varied embodiment of the semiconductor device in FIG. 1.

Embodiments of the present invention may be varied in various ways without limitation to the foregoing embodiments. For example, in lieu of each IGBTs 1 to 4, other semiconductor devices may be used such as other type of bipolar transistors, field-effect transistors, thyristors or triacs. Moreover, as shown in FIG. 12, after coating lower electrode layer 5 with first protective film 9, upper electrode layer 6 may be formed on upper surface 5a of lower electrode layer 5 which is protected by first protective film 9 to preferably prevent etching of lower electrode layer 5 when unnecessary portions of upper electrode layer 6 over first protective film 9 are removed by etching.

INDUSTRIAL APPLICABILITY

The present invention can preferably be applied to semiconductor devices which have a plurality of piled semiconducting elements, especially those for configuring an H-type bridge circuit (full bridge circuit) for use in driving a cold cathode fluorescent discharge tube.

What is claimed are:

1. A semiconductor device comprising a lower semiconducting element,
   a lower electrode layer formed on an upper surface of said lower semiconducting element,
   an upper electrode layer formed on an upper surface of said lower electrode layer,
   an upper semiconducting element secured on an upper surface of said upper electrode layer, and
   an adhesive layer for bonding said upper electrode layer and upper semiconducting element,
   wherein the upper surfaces of said lower and upper electrode layers are formed of different materials from each other, the upper surface of said lower semiconducting element has a cell-forming region arranged at a central area of the upper surface in said lower semiconducting element and a cell-free region annularly arranged on an outer periphery of said lower semiconducting element to surround the cell-forming region by the cell-free region, said cell-forming region having a plurality of cells functionable as semiconductively active regions, and said cell-free region having no cell, the upper electrode layer has a notch on said cell-free region in said lower semiconducting element to form a bonding region on the upper surface of said lower electrode layer over said cell-free region, said bonding region being exposed to outside of the upper electrode layer through said notch to attach a lead wire on said bonding region, and the upper semiconducting element is secured on the adhesive layer over the cell-forming region of said lower semiconducting element.

2. The semiconductor device of claim 1, wherein the notch is formed in the upper electrode layer by etching a part of said upper electrode layer outside of the cell-forming region with etching solution.

3. The semiconductor device of claim 1, wherein the upper surface of said lower electrode layer is formed of a metallic material which has a higher adhesive property to the metallic lead wire than that of the upper surface of said upper electrode layer, and the upper surface of said upper electrode layer is formed of a metallic material which has a higher adhesive property to said adhesive layer than that of the upper surface of said lower electrode layer.

4. The semiconductor device of claim 1, wherein said upper electrode layer extends beyond the cell-forming region into the outer periphery of said lower semiconducting element.

* * * * *